United States Patent [19]

Tanaka et al.

[11] Patent Number: 5,570,293
[45] Date of Patent: Oct. 29, 1996

[54] METHOD AND DEVICE FOR MANUFACTURING A SEMICONDUCTOR CHIP

[75] Inventors: Toshiyuki Tanaka; Masaharu Nakamura, both of Mitaka, Japan

[73] Assignee: Tokyo Seimitsu Co., Ltd., Japan

[21] Appl. No.: 268,185

[22] Filed: Jun. 29, 1994

Related U.S. Application Data

[63] Continuation-in-part of Ser. No. 799,185, Nov. 27, 1991, abandoned.

[30] Foreign Application Priority Data

Nov. 29, 1990 [JP] Japan ..................... 2-332095

[51] Int. Cl.⁶ ..................................... G06F 17/00
[52] U.S. Cl. .............. 364/468.28; 235/375; 364/478.15
[58] Field of Search ................... 364/468, 478; 235/375, 385, 462; 156/345, 350, 363, 364; 437/209, 220

[56] References Cited

U.S. PATENT DOCUMENTS

| | | | |
|---|---|---|---|
| 4,567,361 | 1/1986 | Rosenthal | 235/462 |
| 4,794,238 | 12/1988 | Hampton | 235/462 |
| 4,833,306 | 5/1989 | Milbrett | 235/375 |
| 4,930,086 | 5/1990 | Fukasawa | 364/468 |
| 5,015,832 | 5/1991 | Filipski et al. | 235/462 |
| 5,116,174 | 5/1992 | Fried et al. | 409/79 |
| 5,231,585 | 7/1993 | Kobayashi et al. | 364/468 |

FOREIGN PATENT DOCUMENTS

| | | |
|---|---|---|
| 0132520 | 2/1985 | European Pat. Off. |
| 0249762 | 12/1987 | European Pat. Off. |
| 58-202537 | 11/1983 | Japan |
| 124952 | 7/1985 | Japan |
| 64-12094 | 2/1989 | Japan |

OTHER PUBLICATIONS

Research Disclosure "Tape Automated Bonding", Jan., 1988.
Solid State Technology "Proposed Alphanumeric Marking", Jul. 1980.

*Primary Examiner*—Roy N. Envall, Jr.
*Assistant Examiner*—Brian C. Oakes
*Attorney, Agent, or Firm*—Sixbey, Friedman, Leedom & Ferguson, P.C.; David S. Safran

[57] ABSTRACT

Semiconductor chip manufacturing methods and devices are disclosed which store dicing data corresponding to the kinds of wafers, when data indicating the wafer kinds are input, read out the dicing data corresponding to the data input, and cut a wafer set at a given position to a desired shape in accordance with the dicing data to thereby manufacture a semiconductor chip. The manufacturing methods and devices include read means for inputting the data indicating the wafer kinds. According to the manufacturing method and device, a symbol indicating the kind of the wafer is recorded as an identification symbol readable by the read means and on a member moving together with the wafer in a chip manufacturing process that is not part of the product being manufactured, and preferably, is also not part of a recyclable carrier for the wafer to be diced. When the data indicating the kind of the wafer is input, the identification symbol recorded in the above-mentioned member is read out by the read means.

9 Claims, 7 Drawing Sheets

Dicing

Expanding tape horizontally

Washing to remove bar code

Dissolving adhesive to remove chips from tape

Frame recycling

Tape disposal

METHOD AND DEVICE FOR MANUFACTURING A SEMICONDUCTOR CHIP

CROSS-REFERENCE TO RELATED APPLICATION

This application is a continuation-in-part of U.S. patent application Ser. No. 07/799,185, filed Nov. 27, 1991, now abandoned.

FIELD OF THE INVENTION

The present invention relates to methods and devices for manufacturing a semiconductor chip and, in particular, to such methods and devices which can slice out wafers in accordance with dicing data corresponding to the sizes of wafers so as to manufacture a desired semiconductor chip.

DESCRIPTION OF THE RELATED ART

A semiconductor chip manufacturing process requires data used to execute the respective manufacturing steps of the process and the data must be previously registered in a controlling computer. For the respective manufacturing steps, necessary data are called out from the controlling computer and the respective manufacturing steps are executed based on the data read out.

In order to read out such data from the controlling computer, as shown in FIG. 9, an ID number 12 is displayed in the linear part of a wafer 10. In the respective manufacturing steps, the ID number 12 is read and data corresponding to the ID number 12 can be read out from the controlling computer in the respective manufacturing steps. In other words, the ID number 12 serves as an identification number or symbol in the physical distribution of the wafer.

However, when the wafer is cut by a dicer, the ID number 12 may be cut off and thus the ID number 12 may not be recognized with accuracy in a step to be performed after the dicing step. For this reason, in order to solve this problem, as shown in FIG. 10, there is disclosed a method which displays an identification number 44 corresponding to the ID number 12 is provided on a frame F mounting a wafer W thereto through a tape T (Japanese Patent Publication No. 64-12094).

According to the above-disclosed method, there are provided means for generating a relative relation signal indicating a relative relation between the ID number 12 and the identification number 44 given to the frame F. Due to this structure, even when the ID number 12 is cut, the identification number 44 on the frame F can be left and, therefore, even in the step to be performed after the dicing step, by recognizing the identification number 44, the ID number 12 can be identified in the long run.

In general, in a wafer manufacturing process, the wafers W attached to the frame 16 must often be stored by a lot unit in a carrier before they are delivered, or the wafer must be stored one by one into a case before it is delivered. In these cases, without recognizing the identification number 44 registered in the frame F, an operator key inputs the kind, name or the like of the wafer W entered in a card or a slip attached to the carrier or case to thereby read out necessary data from a dicer or a controlling computer connected to the dicer, so that the wafer W can be cut by the dicer in accordance with the data invoked.

However, in recent years, the respective steps of the wafer manufacturing process have been automated to such an extent that a plurality of machines can be operated by an operator. For this reason, it has been hard for the operator to have special knowledge of each of the machines and the wafer to be manufactured. This causes troubles to occur, makes it difficult to operate the machine quickly, and gives rise to the lowered productivity.

Furthermore, as can be seen from FIG. 11, the frame F is not diced with the wafer W and is recycled for use with various wafers and identification codes, requiring the identification number 44 to be changed to correspond to other wafers with which it is used. However, it is hard to remove the identification number 44 from the frame F, posing a further complication affecting productivity.

SUMMARY OF THE INVENTION

The present invention aims at eliminating the drawbacks found in the above-mentioned wafer manufacturing methods and devices according to the prior art.

Accordingly, it is an object of the invention to provide semiconductor chip manufacturing methods and devices which can be operated in a simple manner with no need of special knowledge of machines to be used and thus can enhance productivity.

In order to accomplish the above object, according to the invention, there is provided a semiconductor chip manufacturing method which comprises the steps of: storing dicing data corresponding to the kinds of wafers; when the data indicating the kind of the wafer is input, reading out the dicing data corresponding to the data input; and, cutting the wafer set at a given position to a desired shape in accordance with the dicing data, characterized in that there is provided read means for inputting the data indicating the kind of the wafer, and also in that a symbol indicating the kind of the wafer is recorded as an identification number which can be read by the above-mentioned read means on a member moving together with said wafer in a chip manufacturing process that is not part of the product being manufactured, and preferably, is also not part of a recyclable carrier for the wafer to be diced, and when the data indicating the kind of the wafer is input, the above-mentioned identification number recorded in the above-mentioned member can be read by the above-mentioned read means.

According to the invention, a symbol indicating the kind of a wafer is recorded in a member moving together with the wafer in a chip manufacturing process, for example, in a storage case for storing the wafer therein, in a wafer identification card attached to the storage case, or on a frame for holding the wafer, but preferably is on a tape used to attach the wafer to the frame, as an identification number such as a bar code or the like which can be read by read means, and, when the data indicating the kind of the wafer is input, the identification number recorded in one of the above-mentioned members can be read by the read means. For this reason, even if an operator does not have special knowledge of machines to be used in the chip manufacturing process and of wafers to be manufactured, it is possible for the operator to operate the machines with ease.

BRIEF DESCRIPTION OF THE DRAWINGS

The exact nature of this invention, as well as other objects, features and advantages thereof, will be readily apparent from consideration of the following specification relating to the accompanying drawings, in which like reference characters designate the same or similar parts throughout the figures thereof and wherein.

DETAILED DESCRIPTION OF THE PREFERRED EMBODIMENTS

Detailed description will hereunder be given of the preferred embodiments of a method for manufacturing a semiconductor chip and a device for performing the same method according to the present invention with reference to the accompanying drawings.

Figure 1:
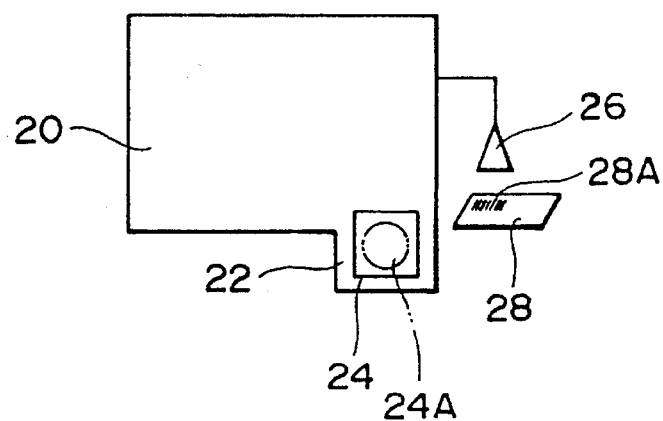
FIG. 1 is a plan view of a dicer employed in a semiconductor chip manufacturing device according to the invention.

In FIG. 1, there is shown a plan view of a dicer 20. The dicer 20 includes a wafer supply part 22 which is able to receive a wafer case 24 conveyed from a previous manufacturing step. A wafer 24A is stored in the wafer case 24. Also, in the dicer 20, there is provided a bar code reader 26 which is able to recognize a bar code 28A displayed on a card 28 to be described later only tracing the surface of the card 28. The card 28 is attached to the wafer case 24 and is then conveyed together with the wafer case 24.

Figure 2:
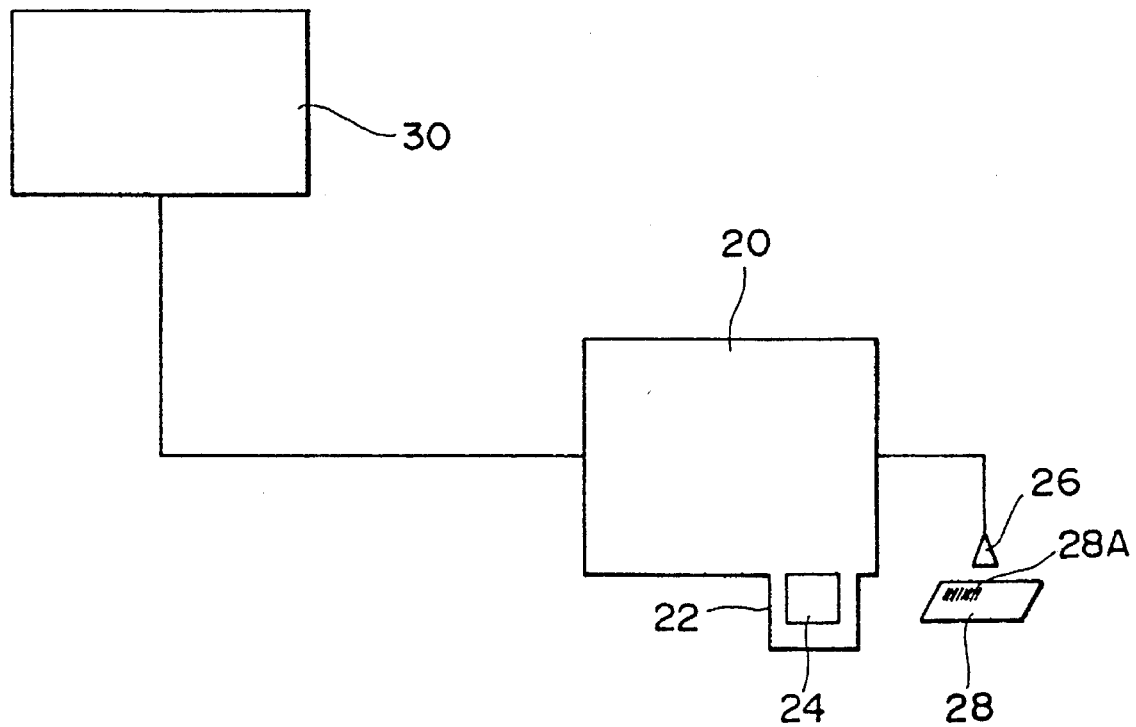
FIG. 2 is a plan view of a dicer and a controlling computer employed in the invention, illustrating a relation between them.

Also, the dicer 20, as shown in FIG. 2, is connected to a controlling computer 30 and, in general, data necessary for the dicer 20 is previously registered in the controlling computer 30. However, data not registered in the controlling computer 30 is registered in a memory part of the dicer 20 and the registered data is set to be transmittable to the controlling computer 30.

Figure 3:
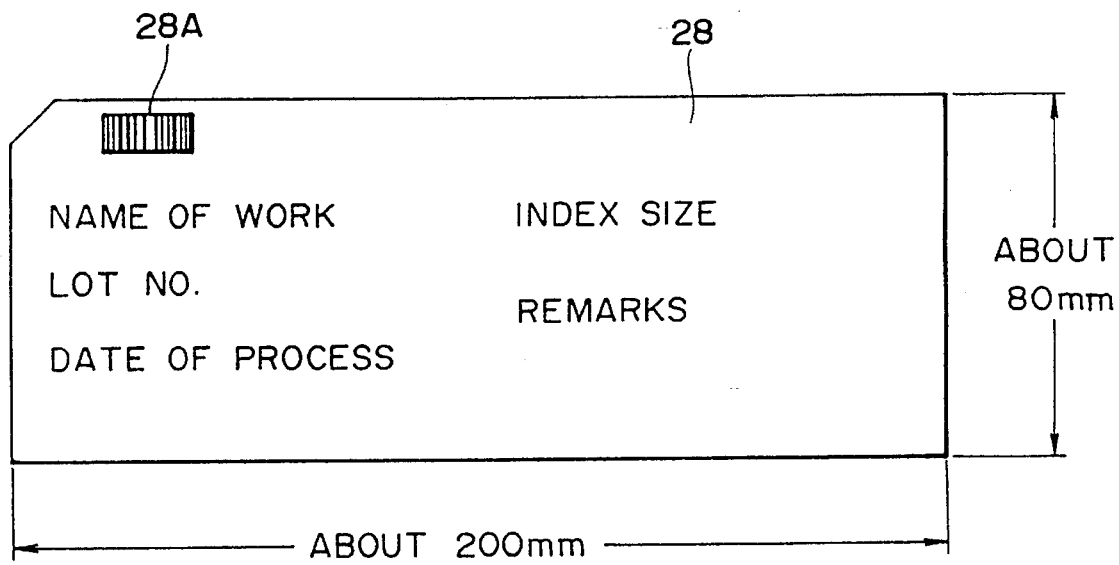
FIGS. 3 and 4 are respectively plan views of cards used in a semiconductor chip manufacturing method according to the invention.

With regard to the shape and kind of the card 28 described above, such cards as shown in FIGS. 3 and 4 can also be employed. A card 28 shown in FIG. 3 is formed in a so called mark sheet card size (having a length of about 200 mm, and a height of about 80 mm). A bar code 28A is displayed on the upper left portion of FIG. 3 by means of bonding, printing or similar means.

Figure 9:
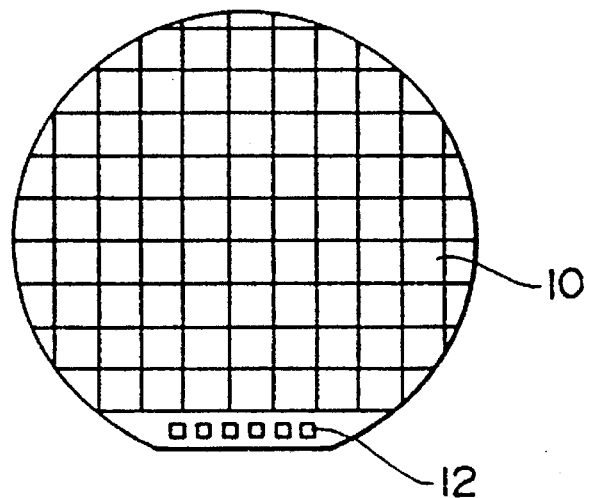
FIG. 9 is a plan view of a wafer.
Figure 10:
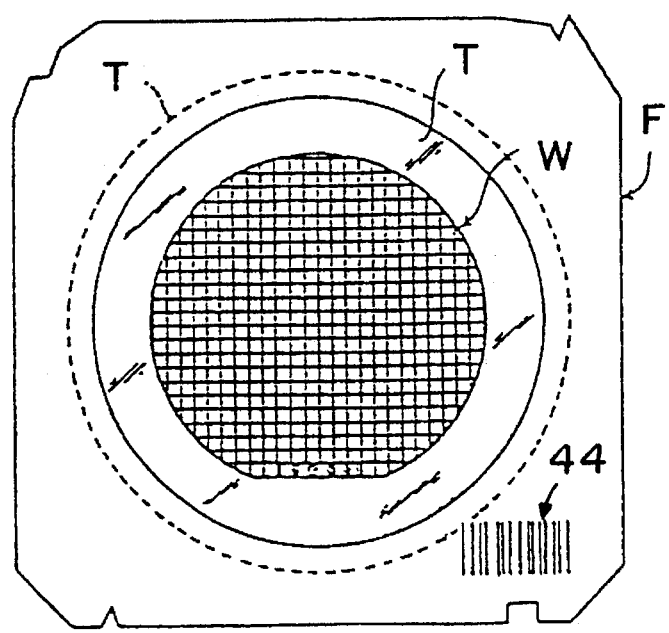
FIG. 10 is a plan view of a prior art wafer and a frame.
Figure 11:
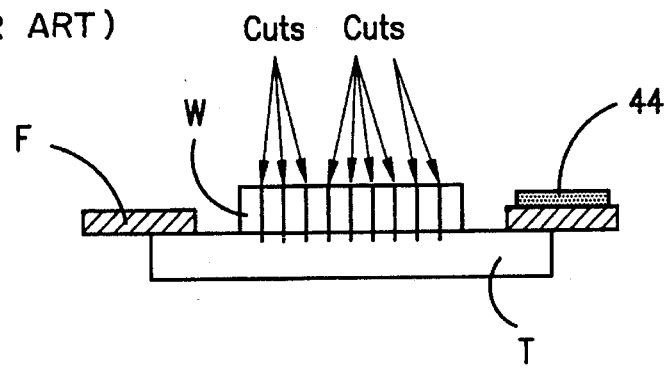
FIG. 11 is a diagrammatic depiction of a prior art processing method using the wafer and frame of FIG. 10.
Figure 11:
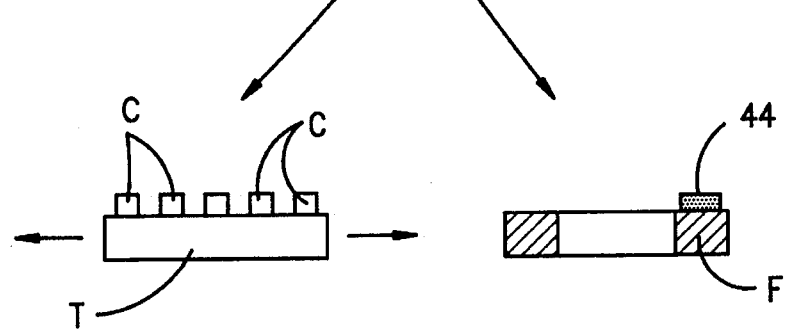
Figure 11:
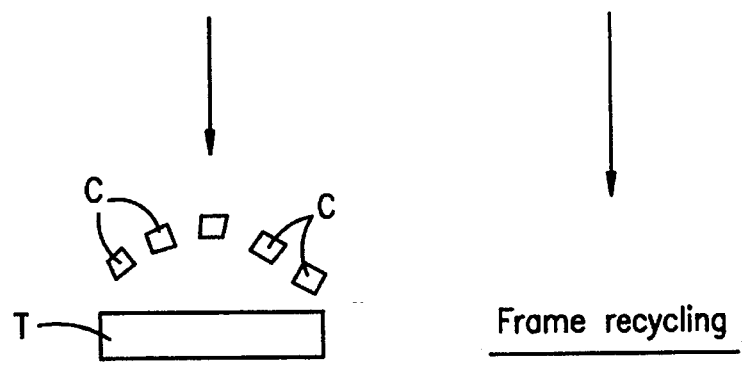

The bar code 28A is set such that it has a given relation with respect to an ID number 12 (see FIG. 9) which is displayed on the wafer 10.

Figure 5:
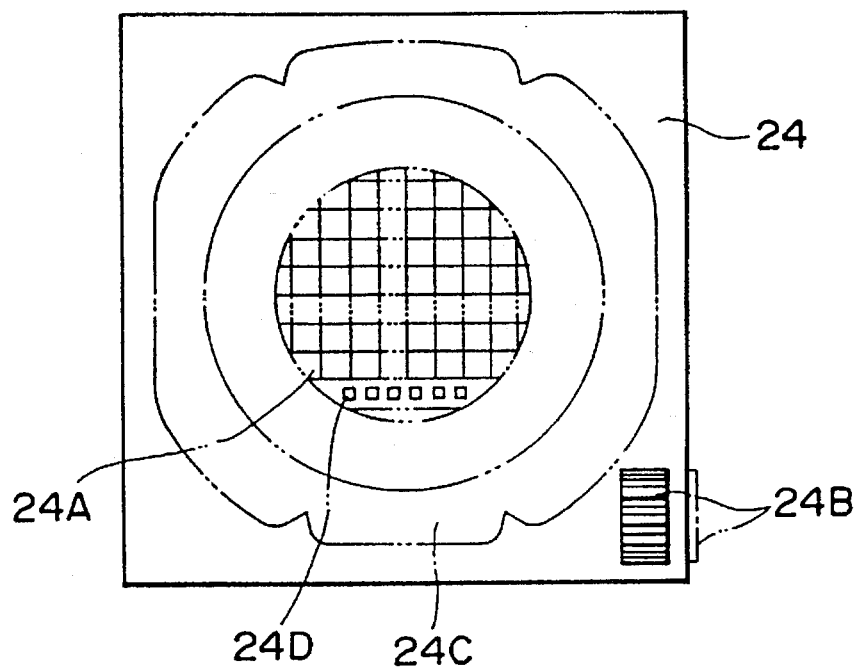
FIG. 5 is a plan view of a wafer case for storing a wafer therein.

For example, it is possible to employ a method in which the number of the bar code 28A is marked as a specific value on a carrier 24 for storing the wafer 24A therein and the bar code number is managed by means of the number of frames. In other words, in a previous step to the dicer 20, when or after the wafer 24A is attached to the frame 24C by means of a mounter (not shown), a bar code number, which is shown in Table 1 and corresponds to the kind of the wafer 24A, is marked on the carrier 24 and the marked data is managed by the controlling computer or the marked data is stored in a floppy disc, a memory card, a magnetic card or the like. And, the bar code number is registered in the card 28. In FIG. 5, 24D designates an ID number.

TABLE 1

| Kinds of Wafers | Bar Code Nos. |
| --- | --- |
| TSK001 | 000001 |
| TSK100 | 010000 |
| : | : |

For another example, the number of the bar code 28A may be set to be identical with the kind of the wafer 24A, as shown in Table 2.

TABLE 2

| Kinds of Wafers | Bar Code Nos. |
| --- | --- |
| TSK001 | TSK001 |
| TSK100 | TSK000 |
| : | : |

A user's mark, a rod No., the date of processing, a wafer size and the like can be written into the remaining spaces of the card 28.

Figure 4:
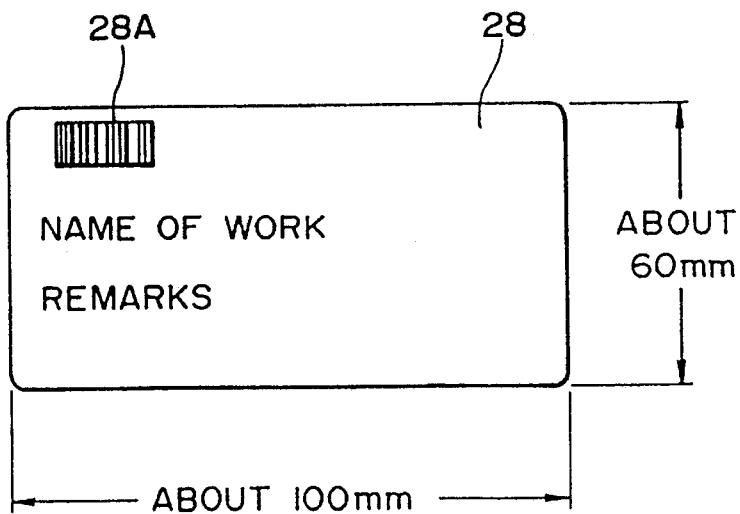

Referring now to FIG. 4, a card 28 is formed in the shape of a so called telephone card size (having a length of about 100 mm, and a height of about 60 mm). Similarly to the card of FIG. 3, a bar code 28A is displayed in the left end portion of the card 28 and a user's mark, an index, a wafer size and the like can be written into the remaining spaces of the card 28. Also, in the magnetic portion of the back surface of the card 28, a rod No. the date of processing and the like can be registered and the data registered in such magnetic portion can be rewritten.

Next, description will be given below of the operation of the semiconductor chip manufacturing device of the invention constructed in the above-mentioned manner.

At first, the processing data of the wafers are previously registered in a controlling computer 30 shown in FIG. 2 in such a manner that the wafer processing data correspond to the ID numbers of the wafers (that is, a relation shown in Table 1 or Table 2 is registered). And, as for the data not registered in the controlling computer 30, the data are previously registered in a memory part of the dicer 20 and such data are set to be transmittable to the controlling computer 30.

Next, a bar code writer (not shown) in a previous step to the dicer 20 is used to bond or print the bar code 28A at a given position of the card 28, the card 28 is attached to the wafer case 24, and the card 28 is delivered together with file wafer case 24. When the wafer case 24 is delivered to a wafer supply part 22 of the dicer 20, then an operator takes off the card 28 attached to the wafer case 24 and the bar code reader 26 is contacted with the surface of the card 28 to thereby read out the bar code 28A.

The bar code reader 26 reads out the bar code 28A and at the same time requests necessary data from the controlling computer 30 in accordance with the signal of the bar code 28A. Responsive to this, the necessary data is applied from the controlling computer 30 to the dicer 20 and the dicer 20, in accordance with the thus applied data, aligns the wafer 24A of the wafer case 24 by use of alignment means and then cuts the wafer 24A with the rotary edges thereof into a desired semiconductor chip.

Although, in the above-mentioned embodiment, the controlling computer 30 is used to change the kinds of the wafers in the dicer 20, this is not limitative, but only the memory part of the dicer 20 can be used to carry out the wafer kind change. In this case, the bar code reader 26 calls out data, which corresponds to the bar code 28A read out, from the memory part of the dicer 20 and, responsive to the data called out, the dicer 20 is set to be operable (that is, the dicer 20 is switched to a state thereof suitable for machining of the wafer 24A). As a result of this, the wafer 24A can be aligned and diced.

As mentioned above, the bar code reader 26 of the dicer 20 is able to recognize the bar code 28A simply by touching the surface of the card 28 and is also able to output the thus recognized signal computer 30 to call out the necessary data therefrom. Due to this, when the wafer 24A is diced by use of the dicer 20, the need for an operator to input the data is eliminated, thereby reducing the occurrences of troubles as well as enhancing the productivity of the wafers.

Also, due to the fact that the bar code reader 26 is inexpensive when compared with a recognizing device for recognizing the ID number, even if the bar code reader is provided in every wafer manufacturing step, it does not increase the cost of the wafer manufacturing line.

Further, in the above-mentioned embodiment, the bar code 28A is registered as another embodiment for displaying the ID number. However, this is not limitative, but other display means such as a magnetic card or the like can also be employed, provided that it can be recognized easily.

Figure 6:
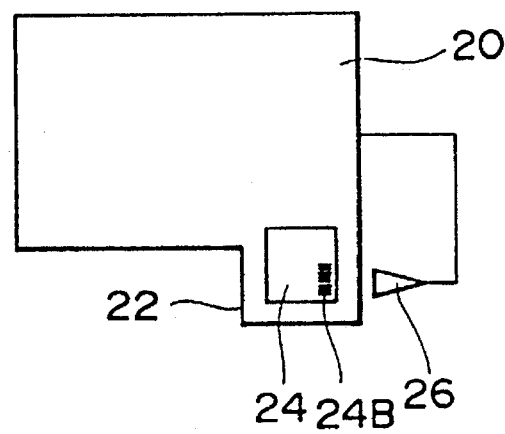
FIG. 6 is a plan view of a state in which the wafer case has been carried to the dicer.
Figure 8:
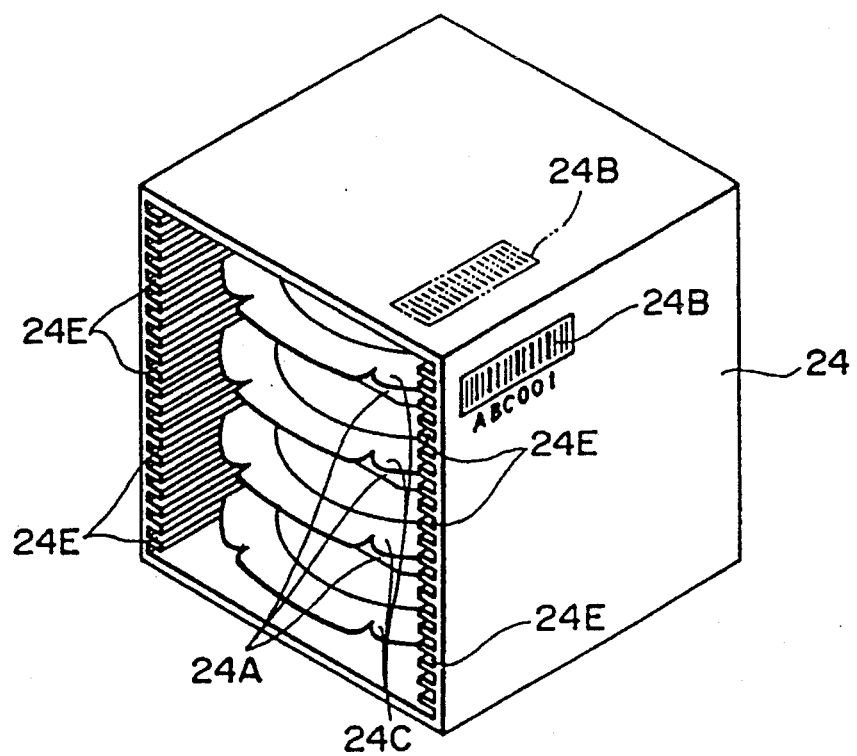
FIG. 8 is a perspective view of a carrier employed in the invention, illustrating a state in which wafers are stored in the carrier.

In the above-mentioned embodiment, the bar code 28A is displayed on the card 28. However, the invention is not limited to this but, as shown in FIG. 5, a bar code 24B may be displayed on the wafer carrier 24. In this case, as shown in FIG. 6, when the wafer carrier 24 is conveyed to the wafer supply part 20, the operator uses the bar code reader 26 to read the bar code 24B. By the way, FIG. 5 is a plan view of FIG. 8 and the bar code 24B can be displayed on the upper surface, side surface or the like of the wafer carder 24. Also, in FIG. 8, 24E designates a groove into which the wafer 24 is mounted.

Also, in the above-mentioned embodiment, the bar code is displayed on the card 28 or on the wafer case 24. However, other way of displaying is also possible.

Figure 7:
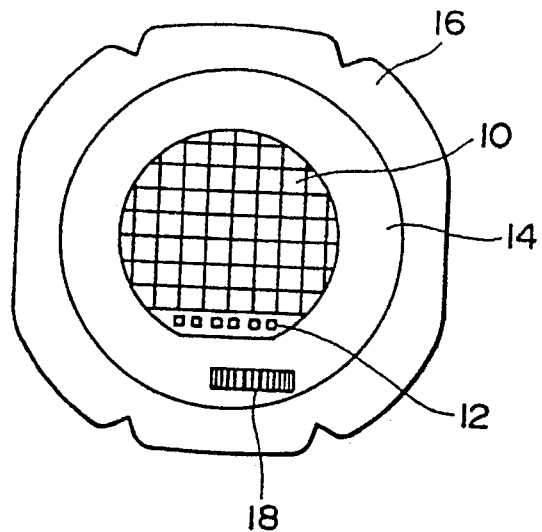
FIG. 7 is a plan view of is a plan view of a wafer and a frame illustrating a state in which the wafer has been mounted on the frame for processing according to a most preferred embodiment of a semiconductor chip manufacturing method of the invention.
Figure 12:
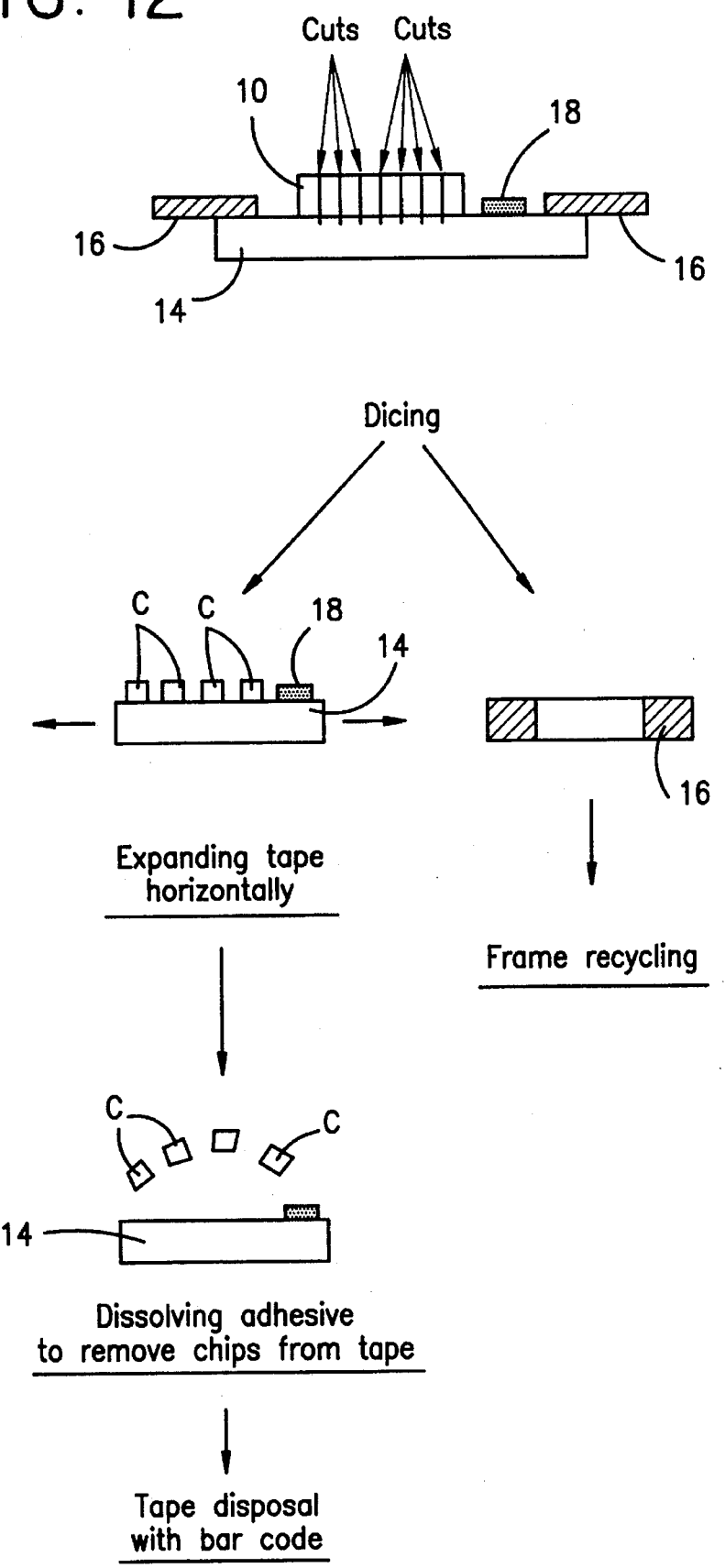
FIG. 12 is a diagrammatic depiction of a manufacturing method of the present invention using the wafer and frame of FIG. 7

However, a most advantageous, and thus, most preferred embodiment is that shown in FIG. 12 utilizing the wafer and frame arrangement shown in FIG. 7. In this case, the identification 18 is provided on the tape 14 used to attach the wafer 10 to the frame 16. The advantage to this approach is that the surface layer of tape is diced with the wafer 10, so that a given tape is used for only one wafer, thereby eliminating the need to remove the identification 18 from any reusable component, such as a frame or carrier. On the other hand, in the subsequent step of removing the chips C from the tape 14, the identification 18 is removed and disposed of along with the tape 14 which is expanded and then has its adhesive dissolved to free the chips C. Removal of the identification 18 at this late stage of the manufacturing process is not a significant disadvantage since it is available for use in controlling of the dicing step and those steps leading up to the dicing step, which are of primary importance.

As has been described heretofore, according to method and device for manufacturing a semiconductor chip in accordance with the present invention, even without special knowledge of machines used in the present manufacturing method and wafers to be manufactured, the machines can be operated with ease so that the productivity of the wafers can be enhanced.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A semiconductor chip manufacturing method comprising the steps of:

marking a bar code indicating a kind of a wafer on a member that is separate and independent from any part of the product being manufactured and is separate and independent from any part of a recyclable carrier for the wafer to be diced, attaching the wafers to the frame by the member marked with the bar code, and moving the marked member together with the wafer in a chip manufacturing process;

providing a bar code reader for reading the bar code and a memory part for memorizing dicing data corresponding to each of various kinds of wafers;

reading the bar code marked on the member with the bar code reader;

reading out dicing data from the memory part corresponding to the kind of wafer indicated by the bar code which is read; and, cutting the wafer to a desired shape in accordance with the dicing data which is read out to thereby manufacture a semiconductor chip.

2. The semiconductor chip manufacturing method as set forth in the claim 1, comprising the steps of:

storing multiple wafers of a kind in a storage case;

(a) taking out the wafers one by one from the storage case and cutting the wafers taken out to the desired shape in accordance with the dicing data which is read out;

(b) returning the wafers which are cut in to the storage case; and, repeating process steps (a) and (b) for all wafers stored in the storage case.

3. The semiconductor chip manufacturing method as set forth in the claim 1, wherein the member marked with the bar code is a tape by which the wafers are attached to a frame for holding the wafer.

4. The semiconductor chip manufacturing method as set forth in the claim 3, wherein the tape marked with the bar code is attached to the wafers and to the frame by an adhesive of the tape; and wherein the tape marked with the bar code is removed from the frame after said cutting step and is removed from the chips by a subsequent step of dissolving the adhesive of the tape for removing the chips from the tape.

5. A semiconductor chip manufacturing method comprising the steps of:

mounting a wafer to a carrier via a member having adhesive thereon providing a magnetic record part on said member, so that the magnetic record part moves with the wafer and carrier, and recording magnetic data in the magnetic record part indicating a kind of wafer for said wafer;

providing a magnetic reading means for reading the magnetic data on the magnetic record part and a memory part for memorizing dicing data corresponding to each of various kinds of wafers;

reading the magnetic data on the wafer record part with the magnetic reading means;

reading out dicing data from the memory part corresponding to the kind of wafer indicated by the magnetic data which is read; and, cutting the wafer to a desired shape in accordance with the dicing data which is read out to thereby manufacture a semiconductor chip;

removing the member with the magnetic record part from the carrier and then transferring the carrier for recycling;

then transferring chips formed during said cutting step with the member with the magnetic record part for cleaning of the adhesive of the member from the chips; and disposing of the member with the magnetic record part.

6. The semiconductor chip manufacturing method as set forth in the claim 5, comprising the steps of:

storing multiple wafers of a kind in a storage case;

(a) taking out the wafers one by one from the storage case and cutting the wafers taken out to the desired shape in accordance with the dicing data which is read out;

(b) returning the wafers which are cut into the storage case; and, repeating process steps (a) and (b) for all wafers stored in the storage case.

7. A semiconductor chip manufacturing method comprising the steps of:

registering wafer names for each of various kinds of wafers and a bar code corresponding to the wafer name for each kind of wafer in a table;

putting a wafer name on a portion of a tape having adhesive thereon by which the wafer is attached to a carrier;

providing a bar code reader for reading the bar code and a memory part for memorizing dicing data corresponding to each of the various kinds of wafers;

searching to find a bar code from the table which corresponds to the wafer name put on the tape;

reading the bar code which is found with the bar code reader;

reading out the dicing data from the memory part corresponding to the kind of wafer indicated by the bar code which is read; and, cutting the wafer to a desired shape in accordance with the dicing data which is read out to thereby manufacture a semiconductor chip.

8. The semiconductor chip manufacturing method as set forth in the claim 7, wherein the portion of the tape with the wafer name is removed from the carrier after said cutting step and is removed from the chips by a subsequent step of dissolving adhesive of the tape for removing the chips frown the tape.

9. In a semiconductor chip manufacturing device having a memory part for memorizing dicing data corresponding to each of various kinds of wafers and means for cutting the wafer to a desired shape in accordance with dicing data which is read out from the memory part to thereby manufacture a semiconductor chip, the improvement comprising:

a member which moves together with the wafer in a chip manufacturing process and which is marked with a bar code indicating a kind of wafer;

a bar code reader for reading the bar code marked on the member; and a means for reading out dicing data from the memory part corresponding to the kind of the wafer indicated by the bar code read by the bar code reader;

wherein the member marked with the bar code is a tape by which the wafer is mounted to a frame for holding the wafer.

* * * * *